(12) United States Patent
Nakano

(10) Patent No.: US 11,380,608 B2
(45) Date of Patent: Jul. 5, 2022

(54) SEMICONDUCTOR MODULE

(71) Applicant: Fuji Electric Co., Ltd., Kanagawa (JP)

(72) Inventor: Hayato Nakano, Yamanashi (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/140,757

(22) Filed: Jan. 4, 2021

(65) Prior Publication Data

US 2021/0272890 A1 Sep. 2, 2021

(30) Foreign Application Priority Data

Feb. 28, 2020 (JP) .............................. JP2020-032630

(51) Int. Cl.
*H01L 23/498* (2006.01)
*H01L 23/00* (2006.01)
*H01L 23/31* (2006.01)

(52) U.S. Cl.
CPC .... *H01L 23/49833* (2013.01); *H01L 23/3121* (2013.01); *H01L 24/29* (2013.01); *H01L 24/37* (2013.01); *H01L 24/45* (2013.01); *H01L 24/73* (2013.01); *H01L 2224/37013* (2013.01); *H01L 2224/73151* (2013.01); *H01L 2924/13055* (2013.01)

(58) Field of Classification Search
CPC ...................... H01L 24/32; H01L 2224/32057
See application file for complete search history.

(56) References Cited

U.S. PATENT DOCUMENTS

| 2012/0181682 | A1 | 7/2012 | Soyano |
| 2014/0084438 | A1* | 3/2014 | Soyano ............ H01L 23/49844 |
| | | | 257/676 |
| 2015/0187671 | A1 | 7/2015 | Fukuda et al. |
| 2019/0259837 | A1 | 8/2019 | Masuda |
| 2021/0225743 | A1* | 7/2021 | Oogushi ................. H01L 23/04 |

FOREIGN PATENT DOCUMENTS

| JP | S60-170957 | A | 9/1985 |
| JP | 2003-188336 | A | 7/2003 |
| JP | 2007-109880 | A | 4/2007 |
| JP | 2007-258628 | A | 10/2007 |
| JP | 2008-66561 | A | 3/2008 |
| JP | 2016-29676 | A | 3/2016 |
| JP | 2019-145641 | A | 8/2019 |
| WO | 2011/115081 | A1 | 9/2011 |

* cited by examiner

*Primary Examiner* — Yu-Hsi D Sun
(74) *Attorney, Agent, or Firm* — Chen Yoshimura LLP

(57) ABSTRACT

A semiconductor module includes a substrate on which first, second, and third circuit boards that are electrically isolated from each other are formed; a semiconductor element arranged on the first circuit board; a connecting member that bridges an upper surface electrode of the semiconductor element and the second circuit board so as to electrically connect the upper surface electrode to the second circuit board; a wire that electrically connects the third circuit board to a first electrode that is located outside of where the first, second and third circuit boards are located in a plan view; and a sealing resin that covers and seals the substrate, the semiconductor element, the connecting member, and the wire, wherein the wire is wired from the third circuit board to the first electrode so as to cross the semiconductor element at a vertical position lower than an upper surface of the connecting member.

15 Claims, 7 Drawing Sheets

SEMICONDUCTOR MODULE

BACKGROUND OF THE INVENTION

Technical Field

The present invention relates to a semiconductor module.

Background Art

A certain type of semiconductor device has a semiconductor element provided with switching elements such as an IGBT (Insulated Gate Bipolar Transistor), a power MOSFET (Metal Oxide Semiconductor Field Effect Transistor), and an FWD (Free Wheeling Diode), and is used for an inverter device or the like. Patent Document 1 describes a specific configuration of this type of semiconductor device.

For example, an in-vehicle inverter device that requires a large current is equipped with a semiconductor module having RC (Reverse Conducting)-IGBT as a semiconductor element. In this type of semiconductor module, as illustrated in Patent Document 1, a plate-shaped connecting member having high heat dissipation is adopted as internal wiring.

In general, semiconductor modules are required to be miniaturized. In order to reduce the size of the semiconductor module, for example, a bonding wire is wired above the plate-shaped connecting member so as to cross the plate-shaped connecting member. That is, the semiconductor module is miniaturized by effectively utilizing the dead space above the plate-shaped connecting member as a wiring space.

RELATED ART DOCUMENT

Patent Document
Patent Document 1: PCT International Publication WO 2011/115081 A1

SUMMARY OF THE INVENTION

In a semiconductor module, various parts such as a semiconductor element, a plate-shaped connecting member, and a bonding wire are sealed with a thermosetting resin in order to protect the internal structure of the module.

In such a configuration, when the semiconductor element operates and generates heat, thermal stress is applied to the sealing resin. Since the difference in thermal expansion coefficient and elastic modulus between the plate-shaped connecting member and the sealing resin is large, this thermal stress is concentrated on the sealing resin near the edge portion on the outer periphery of the upper surface of the plate-shaped connecting member. Due to this stress concentration, cracks may occur in the sealing resin starting from the vicinity of the edge portion. This type of crack usually grows upward on the plate-like connecting member. If the growth of the crack reaches the bonding wire wired so as to cross above the plate-shaped connecting member, the bonding wire may be broken.

The present invention has been made in view of the foregoing, and one of the objects of the present invention is to provide a semiconductor module capable of avoiding breakage of a wire even when a crack of a sealing resin occurs.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor module, comprising: a substrate on which first, second, and third circuit boards that are electrically isolated from each other are formed; a semiconductor element having an upper surface electrode and a lower surface electrode, arranged on an upper surface of the first circuit board so that the lower surface electrode is electrically connected to the first circuit board; a connecting member that bridges the upper surface electrode of the semiconductor element and the second circuit board so as to electrically connect the upper surface electrode to the second circuit board; a wire that electrically connects the third circuit board to a first electrode that is located outside of where the first, second and third circuit boards are located in a plan view; and a sealing resin that covers and seals the substrate, the semiconductor element, the connecting member, and the wire, wherein the wire is wired from the third circuit board to the first electrode so as to cross the semiconductor element above the semiconductor element at a vertical position lower than an upper surface of the connecting member.

According to this aspect of the present invention, it is possible to avoid breakage of the wire even when cracks in the sealing resin occur in the semiconductor module.

It is to be understood that both the foregoing general description and the following detailed description are exemplary and explanatory, and are intended to provide further explanation of the invention as claimed.

DETAILED DESCRIPTION OF EMBODIMENTS

Figure 1:
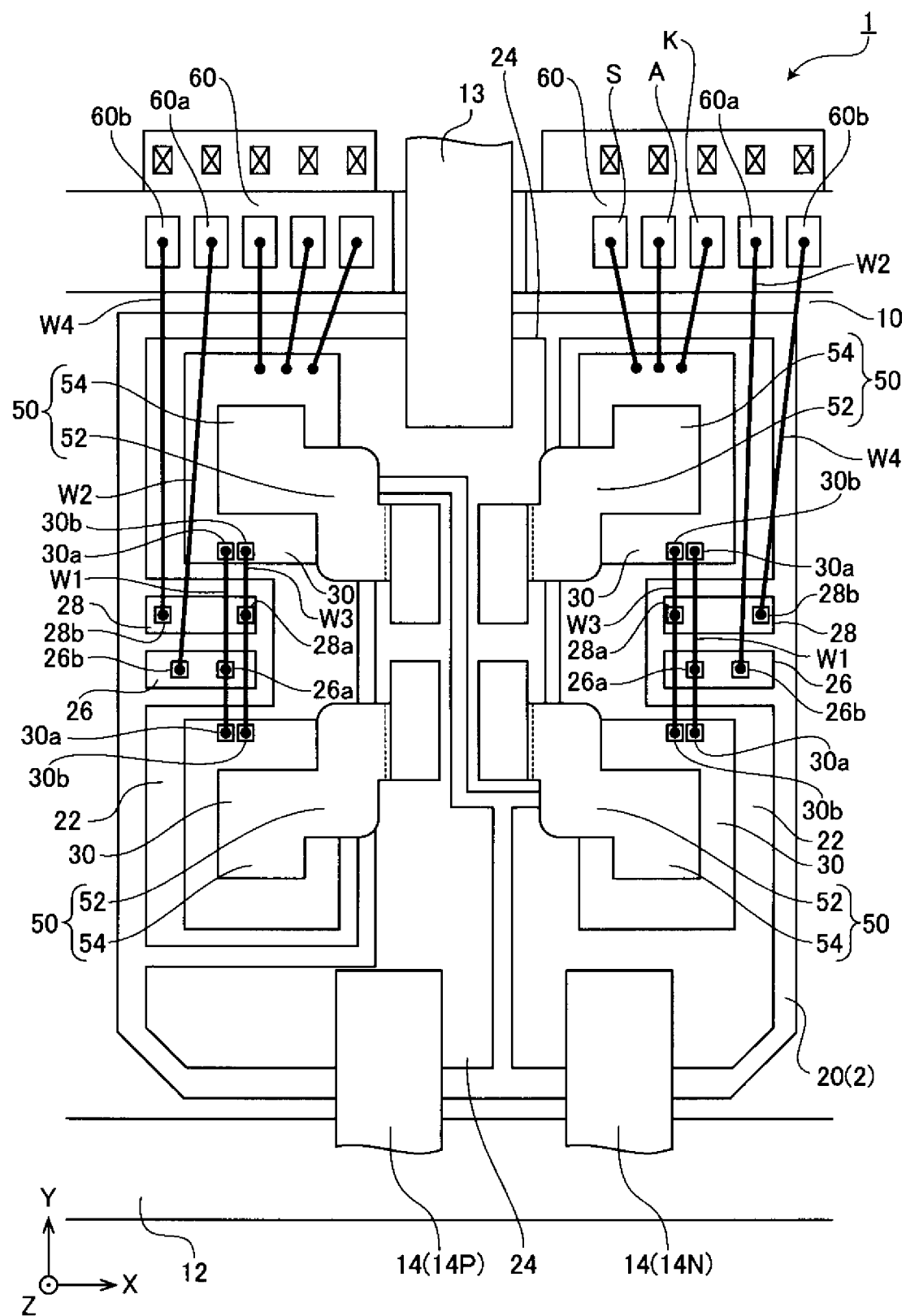
FIG. 1 is a top view of a semiconductor module according to an embodiment of the present invention.

Hereinafter, a semiconductor module to which the present invention can be applied will be described. FIG. 1 is a plan view showing a semiconductor module 1 according to an embodiment of the present invention. The semiconductor module 1 according to the embodiment of the present invention is merely an example, and the present invention is not limited to this and can be appropriately modified.

In the following figures, the lateral direction of the semiconductor module 1 is defined as the X direction, the longitudinal direction is defined as the Y direction, and the height direction is defined as the Z direction. In some cases, the X direction may be referred to as a left-right direction, the Y direction as a front-back direction, and the Z direction as an up-down direction. These directions (front-back, left-right, up-down directions) are terms used for convenience of explanation, and the correspondence with each of the XYZ directions may change depending on the mounting posture of the semiconductor module 1. Further, in the present specification, a plan view means a case where the upper surface of the semiconductor module 1 is viewed from above.

Figure 2:
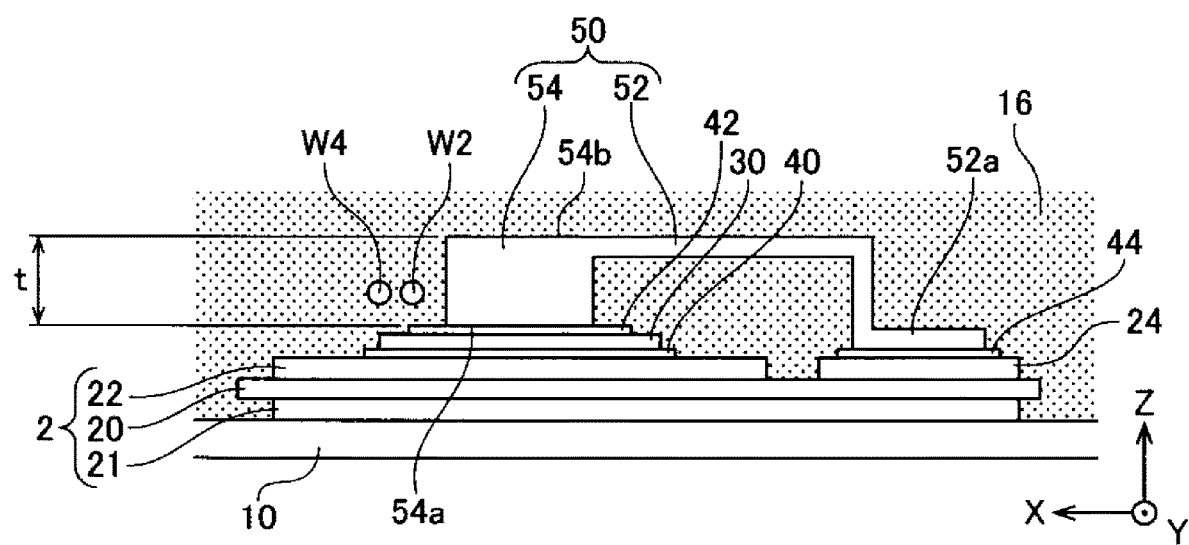
FIG. 2 is a side view schematically showing a structure of the semiconductor element and its periphery in the semiconductor module of an embodiment of the present invention.

The semiconductor module 1 includes, for example, a semiconductor element 30 such as an RC-IGBT, and is applied to a power conversion device such as an inverter device. The semiconductor element 30 may be replaced with a semiconductor element having another structure such as a power MOSFET. FIG. 2 is a schematic view showing the structure of the semiconductor element 30 and its surroundings. The semiconductor element 30 has an upper surface electrode such as an emitter electrode or a source electrode, and a lower surface electrode such as a collector electrode or a drain electrode.

As shown in FIG. 1, the semiconductor module 1 includes a base plate 10, a laminated substrate 2 arranged on the base plate 10, and a case member 12 for accommodating the laminated substrate 2.

The base plate 10 is a metal plate having a rectangular shape in a plan view, made of, for example, copper, aluminum, or an alloy thereof, and acts as a heat radiating plate that radiates heat from the laminated substrate 2 and electronic components mounted therein to the outside.

The case member 12 is a rectangular resin frame body that follows the outer shape of the base plate 10, and is adhered to, for example, the base plate 10 with an adhesive or the like. The space defined by the base plate 10 and the case member 12 is filled with the sealing resin 16. With the sealing resin 16, various parts including the laminated substrate 2, electronic components mounted on the laminated substrate 2, for example, a semiconductor element 30, the connecting member 50, and the bonding wires W1 to W4, which will be described later, are sealed in the above-mentioned space. That is, the laminated substrate 2 and the electronic component are installed inside the case member 12, and the sealing resin 16 fills in a space defined by the case member 12, where the laminated substrate 2 and the electronic component are installed. In FIG. 1, the sealing resin 16 is not shown for ease of illustration.

The laminated substrate 2 is, for example, a DBA (Direct Bonded Aluminum) substrate or an AMB (Active Metal Brazing) substrate. The laminated substrate 2 has an insulating layer 20. The insulating layer 20 is made of, for example, a ceramic material such as alumina ($Al_2O_3$), aluminum nitride (AlN), silicon nitride ($Si_3N_4$), a resin material such as epoxy, or an insulating material such as an epoxy resin material using the ceramic material as a filler.

A metal plate 21 is formed on the lower surface of the insulating layer 20. The metal plate 21 is a metal layer such as a copper foil. The metal plate 21 is joined to the upper surface of the base plate 10 via a joining material (not shown).

A plurality of circuit boards are formed on the upper surface of the insulating layer 20. Specifically, for example, two circuit boards 22, one circuit board 24, two circuit boards 26, and two circuit boards 28 may be formed. Each circuit board is a metal layer such as a copper foil, and is formed in an island shape on the insulating layer 20 in a state of being electrically insulated from each other. The number and shape of the circuit boards shown in FIG. 1 are merely examples, and the number and shape of the circuit boards are not limited to these and can be changed as appropriate.

A semiconductor element 30 having a rectangular shape in a plan view is arranged on each circuit board 22 (first circuit board). As shown in FIG. 2, the semiconductor element 30 is arranged on the upper surface of the circuit board 22 via a bonding material 40 such as solder.

The semiconductor module 1 includes a connecting member 50. The connecting member 50 electrically connects the semiconductor element 30 to the circuit board 24.

The connecting member 50 is a plate-shaped metal member in which a base end portion 52a (second end portion), a connecting portion 52, and a tip end portion 54 (first end portion) are integrally formed. The connecting portion 52 is a thin plate-shaped portion, and connects the base end portion 52a and the tip end portion 54. The tip end portion 54 formed on the tip end side of the connecting portion 52 is thicker than the connecting portion 52. The tip end portion 54 has an upper surface 54b and a lower surface 54a opposite the upper surface 54b. The upper surface 54b faces the sealing resin 16, and the lower surface 54a faces the semiconductor element 30. The connecting member 50 is formed by, for example, pressing or etching. Further, the connecting member 50 is formed by using, for example, a metal plate containing a copper alloy or an iron alloy.

In the connecting member 50, the lower surface 54a of the tip end portion 54 is joined to the upper surface electrode formed on the upper surface of the semiconductor element 30 via a bonding material 42 such as solder. As a result, the semiconductor element 30 and the connecting member 50 are electrically connected.

The connecting portion 52 is formed so as to extend from the upper portion of the tip end portion 54 toward the circuit board 24 (second circuit board). In the illustrated example, the connecting portion 52 extends in the −X direction from the upper portion of the tip end portion 54, then bends downward (in the −Z direction), and then bends again in the −X direction at a position reaching the circuit board 24. The base end portion 52a formed on the base end side of the connecting portion 52 is joined to the wiring pattern on the circuit board 24 via a joining material 44 such as solder.

Connection terminals 13 and 14 are embedded in the case member 12. The connection terminals 13 and 14 are electrically connected to external wirings of the semiconductor module 1. The connection terminal 13 may be used as an intermediate terminal, and the connection terminal 14 may be used as a power supply terminal. In FIG. 1, the circuit board 22 on the right side is electrically connected to the connection terminal 14 on the right side via a bonding material such as solder, the circuit board 22 on the left side is electrically connected to the connection terminal 13 via a bonding material such as solder, and the circuit board 24 is electrically connected to the connection terminal 14 via a bonding material such as solder. Therefore, in FIG. 1, the semiconductor element 30 on the right side is electrically connected to the connection terminal 13 via the connection member 50 and the circuit board 22, and the semiconductor element 30 on the left side is electrically connected to the connection terminal 14 on the left side via the connection member 50 and the circuit board 24. The semiconductor element 30 on the right side may be used as a switch for the upper arm, and the semiconductor element 30 on the left side may be used as a switch for the lower arm. As shown in the figure, the semiconductor module 1 may include two semiconductor elements 30 connected in parallel as a switch for the upper arm, and may include two semiconductor elements 30 connected in parallel as a switch for the lower arm.

The circuit board 26 (third circuit board) is provided with connecting portions 26a and 26b that are electrically connected to each other. One end of a bonding wire W1 (wiring member) is bonded and connected to the connection portion 26a (first connection portion), and the other end of the bonding wire W1 is bonded and connected to the emitter pad (source pad when the semiconductor element 30 is a power MOSFET) 30a formed on the surface of the semiconductor element 30. Further, one end of a bonding wire W2 is bonded and connected to the connecting portion 26b (second connecting portion), and the other end of the bonding wire W2 is bonded and connected to the control electrode 60a (first electrode) formed on a control substrate 60.

That is, the emitter pad 30a is electrically connected to the control electrode 60a via the bonding wire W1, the circuit board 26, and the bonding wire W2. The bottom electrode (collector electrode or drain electrode) is formed on the back surface of the semiconductor element 30, and is not visible in FIG. 1.

The circuit board 26 may be arranged between two semiconductor elements 30 connected in parallel. The emitter pad 30a of one semiconductor element 30 may be arranged on the opposite side of the emitter pad 30a of the other semiconductor element 30 with the circuit board 26 interposed therebetween. In the bonding wire W1, both ends are connected to two emitter pads 30a, and a part between both ends is connected to the connecting portion 26a. The two emitter pads 30a are relayed by the circuit board 26 and electrically connected to the control electrode 60a.

The circuit board 28 (another example of the third circuit board) is provided with connecting portions 28a and 28b that are electrically connected to each other. One end of a bonding wire W3 (wiring member) is bonded and connected to the connecting portion 28a (first connection portion), and the other end of the bonding wire W3 is bonded and connected to the gate pad 30b formed on the surface of the semiconductor element 30. Further, one end of a bonding wire W4 is bonded and connected to the connecting portion 28b (second connection portion), and the other end of the bonding wire W4 is bonded and connected to the control electrode 60b (first electrode) formed on the control substrate 60.

That is, the gate pad 30b is electrically connected to the control electrode 60b via the bonding wire W3, the circuit board 28, and the bonding wire W4.

The circuit board 28 may be arranged between two semiconductor elements 30 connected in parallel. The gate pad 30b of one semiconductor element 30 may be arranged on the opposite side of the gate pad 30b of the other semiconductor element 30 with the circuit plate 28 interposed therebetween. In the bonding wire W3, both ends are connected to two gate pads 30b, respectively, and a part between both ends is connected to the connecting portion 28a. The two gate pads 30b are relayed by the circuit board 28 and electrically connected to the control electrode 60b. The control board 60 may be provided along one side of the case member 12. The control electrodes 60a and 60b may be respectively connected to pin terminals provided along one side of the case member 12 and extending in the positive direction of the Z axis, respectively.

Figure 3A:
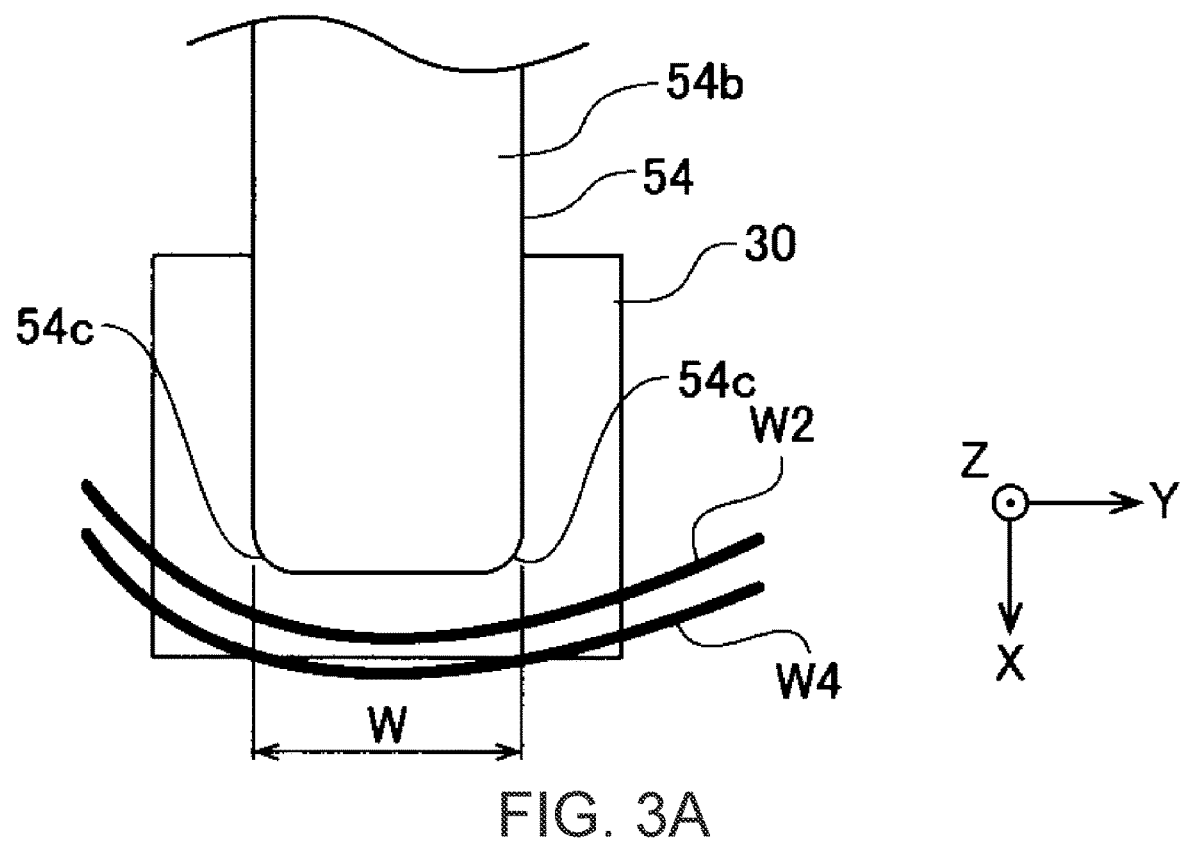
FIG. 3A is a top view schematically showing a positional relationship between the bonding wire and the tip end portion of the connection member in the semiconductor module of the embodiment of the present invention.
Figure 3B:
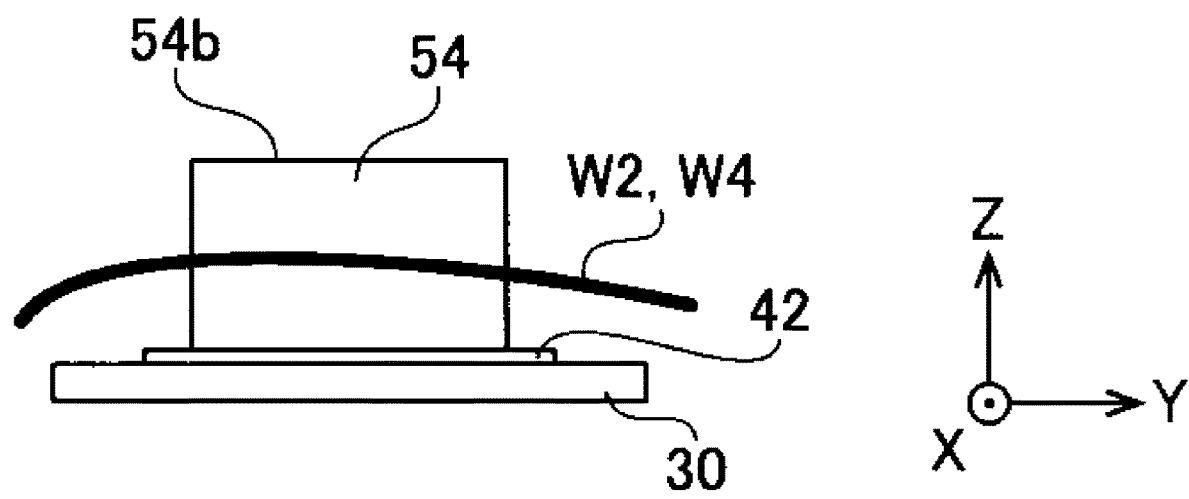
FIG. 3B is a side view schematically showing the positional relationship between the bonding wire and the tip end portion of the connection member in the semiconductor module of the embodiment of the present invention.

FIGS. 3A and 3B are schematic views showing the positional relationship between the bonding wires W2 and W4 and the tip end portion 54 of the connecting member 50. FIG. 3A is a schematic view of the tip end portion 54 as viewed from above. FIG. 3B is a schematic view of the tip end portion 54 when viewed from the front.

As shown in FIG. 1, the circuit boards 26 and 28 are positioned closer to the end side (+X direction side or −X direction side) from the center in the laminated substrate 2 arranged inside the case member 12, and in more detail, are positioned such that the connecting portions 26b and 28b are positioned closer to the +X direction or the −X direction, respectively, than the tip end portions 54 of the connecting members 50. The connecting portions 26b and 28b may be positioned closer to the respective sides of the substrate 2 than the respective tip end portions 54 in the laminated substrate 2. Further, the connecting portions 26b and 28b may be provided at positions separated from the tip end portion 54 father than the connecting portion 52. On the other hand, the control substrate 60 is formed in the case member 12 at a position closer to the end side (+Y direction side) from the center of the laminated substrate 2, and more specifically, at a position closer to the tip end portion 54 in the +Y direction. In order to facilitate the circuit design, the control electrodes of the control board 60 are arranged in a straight line at a position closer to the end side. In order to keep the inductance of the capacitor in the semiconductor module 1 small, the connection terminal 14 (connection terminal 14P which is a P terminal) and the connection terminal 14 (connection terminal 14N which is an N terminal) are arranged close to each other. The connection terminal (intermediate terminal) 13 is arranged at a position aligned with the control board 60 and at a position opposite to the P terminal and the N terminal. As a result, the circuit boards 26 and 28, the semiconductor element 30, and the control board 60 are arranged in that order from the connection terminal (power supply terminal) 14 toward the connection terminal 13. Since the circuit boards 26 and 28 and the control board 60 have such a positional relationship, the connection portion 26b on the circuit board 26 and the connection portion 28b on the circuit board 28, and the control electrodes 60a and 60b of the control board 60 in the case member 12 are arranged at positions facing each other with the circuit board 22 (and the semiconductor element 30) interposed therebetween. As a result, as shown in FIGS. 3A and 3B, at least a part of the bonding wires W2 and W4 are wired so as to cross the semiconductor element 30 above the semiconductor element 30.

When the semiconductor element 30 operates and generates heat, thermal stress is applied to the sealing resin 16. Due to large differences in physical characteristics, such as thermal expansion coefficient and elastic modulus, between the connecting member 50 and the sealing resin 16, the thermal stress is concentrated in the sealing resin 16 near the outer peripheral edge of the upper surface of the connecting member 50. As a result of studies conducted by the inventor, it was found that due to this stress concentration, cracks were generated in the sealing resin 16 starting from the vicinity of the outer peripheral edge of the upper surface of the connecting member 50, and the cracks propagated upward from the connecting member 50. Further, it was found that in the conventional configuration in which the bonding wire is wired so as to cross the connecting member above the connecting member, cracks in the sealing resin propagated upwardly from the connecting member, reached the bonding wired that was wired to cross the upper part of the connecting member, and broke the bonding wires.

Therefore, in an embodiment of the present embodiment, as shown in FIGS. 2, 3A and 3B, the bonding wire W2 is wired from the connection portion 26b on the circuit board 26 to the control electrode 60a on the control substrate 60 such that it crosses the semiconductor element 30 at a vertical position lower than the upper surface 54b of the tip end portion 54 of the connecting member 50. Further, the bonding wire W4 is wired from the control electrode 28b on the circuit board 28 to the control electrode 60b on the control substrate 60 so as to cross the semiconductor element 30 at a vertical position lower than the upper surface 54b.

In this way, by wiring the bonding wires W2 and W4 so as to cross the semiconductor element 30 at a vertical position lower than the upper surface 54b of the tip end portion 54 of the connecting member 50, even if cracks in the sealing resin 16 are formed above the connecting member 50, the bonding wires W2 and W4 will not be broken by the cracks. It is preferable that the highest parts of the loops of the bonding wires W2 and W4 are arranged closer to the upper surface 54b of the tip end portion 54 relative to the main surface of the laminated substrate 2 in terms of the vertical positions so as not to cause a short circuit.

In order to secure a wiring space for the bonding wires W2 and W4 at a vertical position lower than the upper surface 54b of the tip end portion 54, the connecting member 50, which is a plate-shaped member, preferably has a thickness t at the tip end portion 54 (that is, the dimension t from the lower surface 54a to the upper surface 54b of the tip end portion 54) that is greater than other parts of the connecting member 50. The thickness t is preferably 2 mm or more and 8 mm or less in order to secure the wiring space for the bonding wires W2 and W4.

Further, in the semiconductor module 1, it is necessary to avoid contact between the bonding wires W2 and W4 and the circuit board 22, the semiconductor element 30, and the connecting member 50 in order to ensure the insulating property. Since the bonding wires W2 and W4 are wired across the semiconductor element 30 at a vertical position lower than the upper surface 54b of the tip end portion 54 of the connecting member 50 while avoiding contact with the circuit board 22, the semiconductor element 30, and the connecting member 50, the total length of the wires W2 and W4 should be appropriately designed. For example, in typical cases, the total length of each of the bonding wires W2 and W4 is preferably 5 mm or more and 40 mm or less. When the total length of the bonding wire W2/W4 is shorter than 5 mm, the bonding wires W2/W4 cannot straddle the semiconductor element 30 provided with the connecting member 50. When the total length of the bonding wires W2/W4 is longer than 40 mm, the bonding wires W2/W4 are largely loosened, and a part of them comes into contact with the circuit board 22 or the like or protrudes above the connecting member 50.

In the filling process of the sealing resin 16, the bonding wires W2 and W4 may be pushed by the sealing resin 16 poured into the case member 12 and may come into contact with the circuit board 22, the semiconductor element 30, or the connecting member 50. If the sealing resin 16 is cured in a state where the bonding wires W2 and/or W4 are in contact with these members, the insulating property between the bonding wires W2 and W4 and these members cannot be ensured. Therefore, when needed and appropriate, an insulating layer may be formed on the surfaces of the circuit board 22, the semiconductor element 30, and the connecting member 50. Alternatively or in addition, an insulating layer may be formed on the surface of the wires W2 and W4.

The bonding wires W2 and W4 preferably have a wire diameter of, for example, 100 μm or more and 500 μm or less.

As shown in FIG. 3A, the tip end portion 54 of the connecting member 50 has a rectangular shape in a plan view when viewed from above. The width W of the tip end portion 54 (that is, the length in the lateral direction in FIG. 3A (plan view)) is preferably, for example, 5 mm or more and 20 mm or less.

When a sharp edge is formed on the tip end portion 54 of the connecting member 50, thermal stress is concentrated on the sealing resin 16 near such an edge. As shown in FIG. 3A, in order to suppress the concentration of thermal stress near such an edge, the tip end portion 54 of the connecting member 50 may have R chamfered edges (chamfered corner portion 54c) in the rectangular shape in a plan view.

As described above, according to the present embodiment, because the bonding wires W2 and W4 are wired so as to cross the semiconductor element 30 above the semiconductor element 30 at a vertical position lower than the upper surface 54b of the tip end portion 54 of the connecting member 50, even when the cracks in the resin 16 extend upwardly from the connecting member 50, the bonding wires W2 and W4 can be prevented from breaking due to the cracks.

The configuration of the connecting member 50 is not limited to that shown in the above embodiment. Modified examples 1 to 5 of the connecting member 50 will be described with reference to FIGS. 4 to 8. FIGS. 4 to 8 are schematic views similar to that of FIG. 2, but the sealing resin 16 is omitted for ease in illustration. Further, in the modified examples 1 to 5, the shape of the base end side of the connecting portion 52 (in the modified examples 1 and 3, the base end side of the conductive plate 58 described later) is the same as that of the connecting member 50 shown in FIG. 2. Therefore, in FIGS. 4 to 8, the shape of the base end side of the connecting portion 52 (the base end side of the conductive plate 58 in the modified examples 1 and 3) is not shown.

Figure 4:
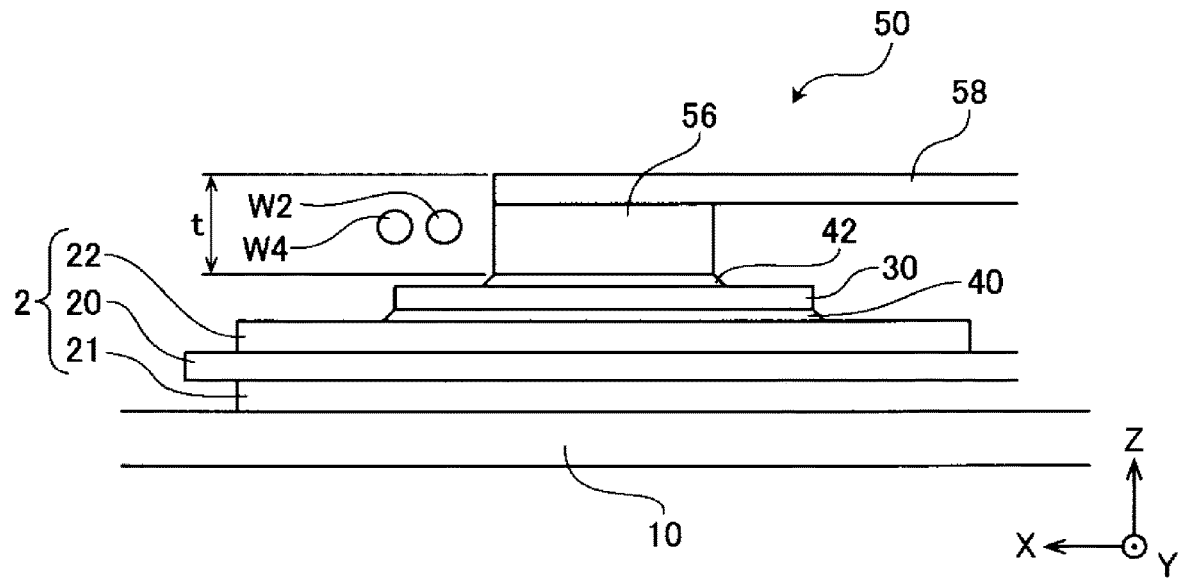
FIG. 4 is a side view schematically showing a structure of a connection member and its periphery according to a first modified example of the embodiment of the present invention.

FIG. 4 is a schematic view showing the structure of a connecting member 50 and its surroundings according to the first modified example. The connecting member 50 according to the first modification is formed by combining a plurality of members.

As shown in FIG. 4, the connecting member 50 according to the first modification has a heat spreader 56 and a conductive plate 58, which is electrically and mechanically joined (for example, joined with a joining material such as welding or solder) to the upper surface of the heat spreader 56 at one end, and which extends from the upper surface of the heat spreader 56 to the circuit plate 24 so as to be electrically connected to the circuit plate 24 at the other end. The heat spreader 56 is a member forming the first end portion, and may be referred to as a spacer. The lower surface of the heat spreader 56 is bonded to the upper surface electrode of the semiconductor element 30 via a bonding material 42 such as solder. As a result, the semiconductor element 30 and the heat spreader 56 (connecting member 50) are electrically connected. The heat spreader 56 and the conductive plate 58 are formed by using, for example, a copper alloy-based or iron alloy-based metal material. The heat spreader 56 and the conductive plate 58 may be formed of the same material, or may be formed of different materials.

Figure 5:
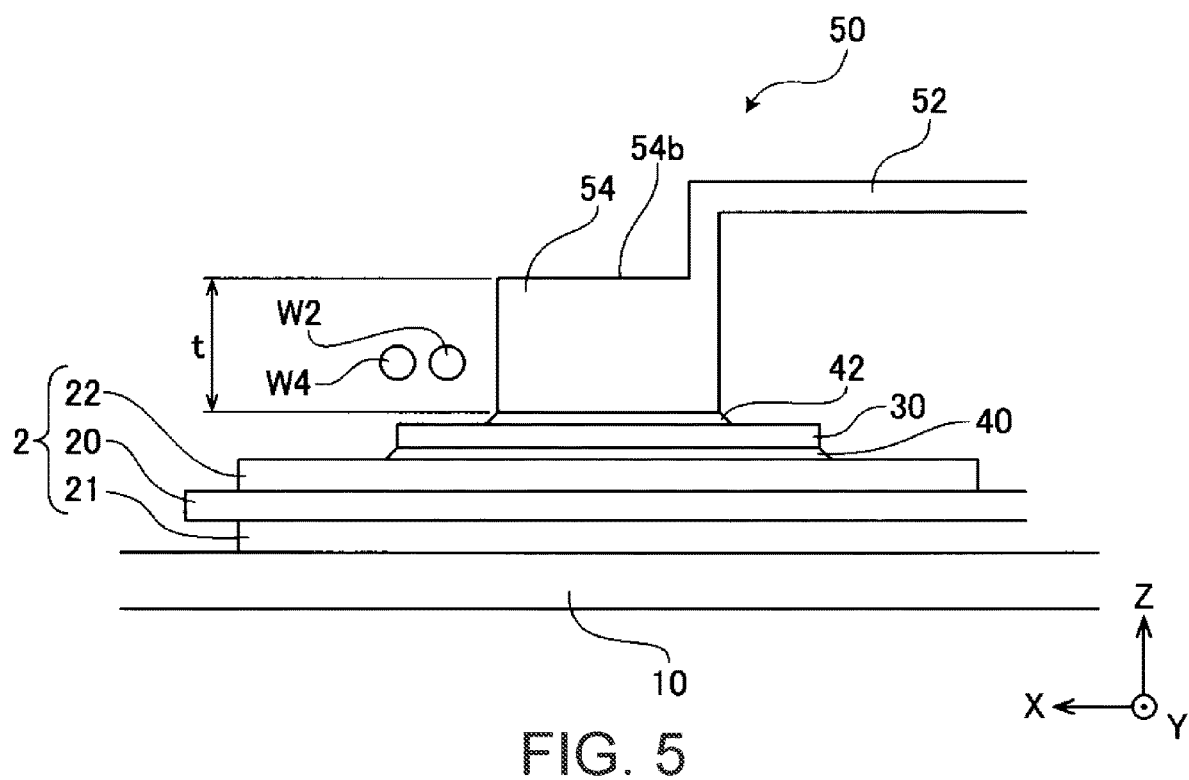
FIG. 5 is a side view schematically showing a structure of a connection member and its periphery according to a second modified example of the embodiment of the present invention.

FIG. 5 is a schematic view showing the structure of a connecting member 50 and its surroundings according to the second modified example. The connecting member 50 according to the second modification has a different shape of the connecting portion 52 from the connecting member 50 shown in FIG. 2. Specifically, the connecting portion 52 according to the second modification is formed by extending upward (+Z direction) from the upper surface 54b of the tip end portion 54 and bending in the −X direction.

Figure 6:
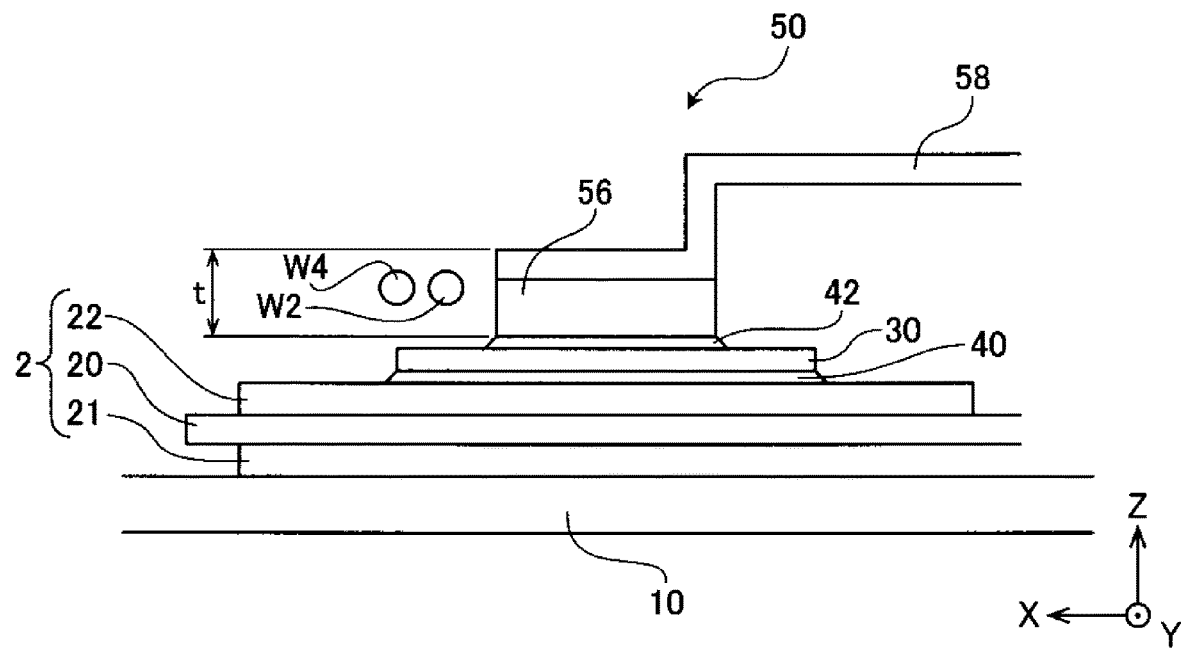
FIG. 6 is a side view schematically showing a structure of a connection member and its periphery according to a third modified example of the embodiment of the present invention.

FIG. 6 is a schematic view showing the structure of a connecting member 50 and its surroundings according to the third modified example. The third modified example is a further modification of the second modified example shown in FIG. 5. Specifically, the connection member 50 according to the third modified example is constructed by modifying the connection member 50 of the second modified example, which was an integrally formed product, such that it is now made by two parts, a heat spreader 56 and a conductive plate 58.

Figure 7:
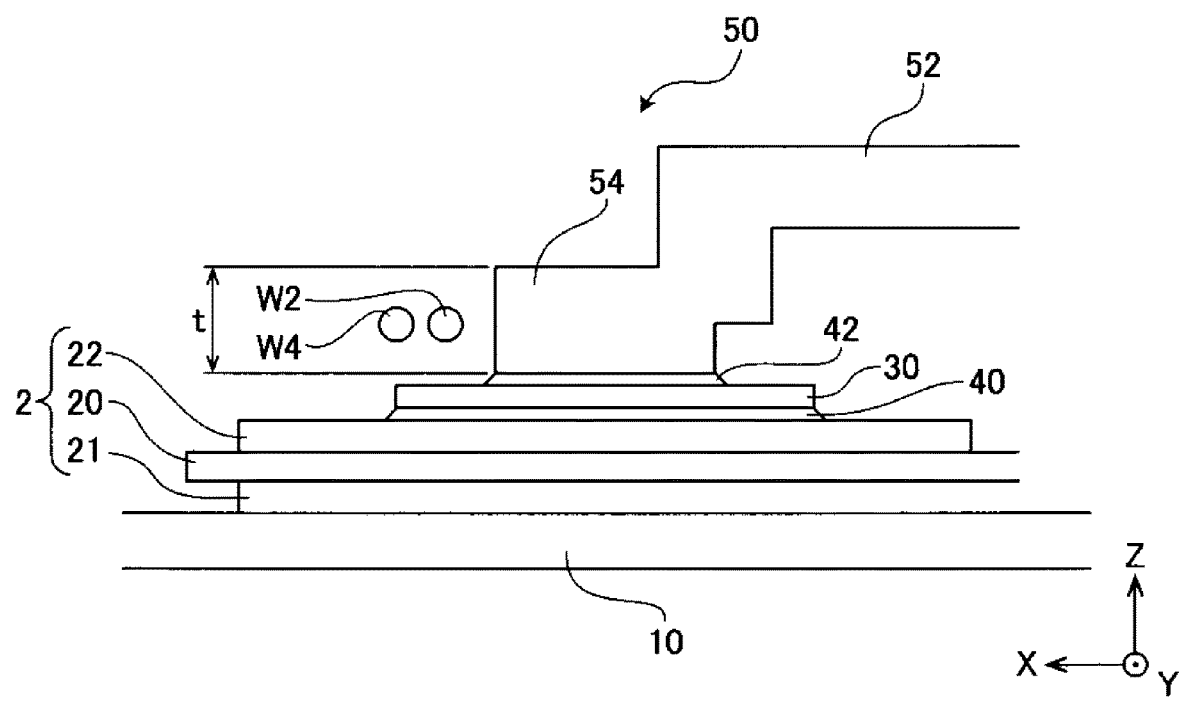
FIG. 7 is a side view schematically showing a structure of a connection member and its periphery according to a fourth modified example of the embodiment of the present invention.

FIG. 7 is a schematic view showing the structure of a connecting member 50 and its surroundings according to the fourth modified example. The fourth modified example is another modified example of the second modified example shown in FIG. 5. Specifically, in the connecting member 50 according to the fourth modified example, the connecting portion 52 has the same thickness as the tip end portion 54 throughout.

Figure 8:
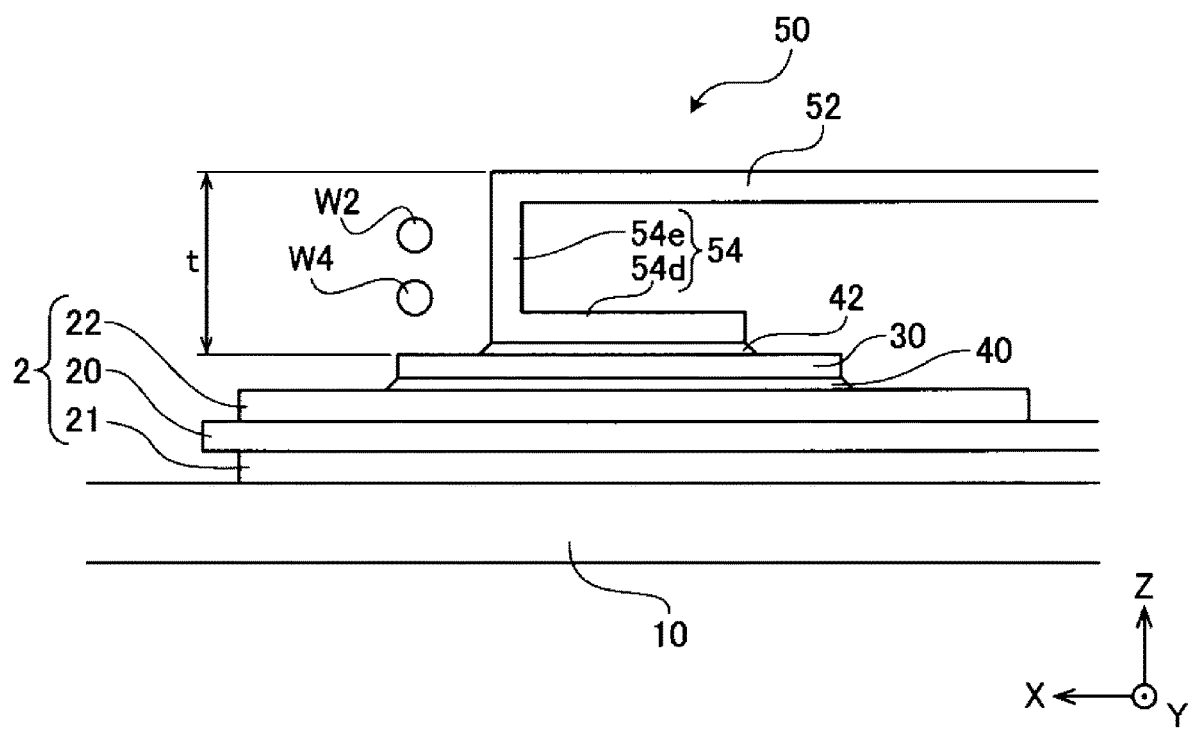
FIG. 8 is a side view schematically showing a structure of a connection member and its periphery according to a fifth modified example of the embodiment of the present invention.

FIG. 8 is a schematic view showing the structure of a connecting member 50 and its surroundings according to the fifth modified example. In the fifth modified example, the tip end portion 54 has a first tip portion 54d and a second tip portion 54e. That is, the connecting member 50 according to the fifth modified example is a plate-shaped metal member in which the base end portion 52a, the connecting portion 52, the first tip portion 54d, and the second tip portion 54e are integrally formed. The connecting portion 52, the first tip portion 54d, and the second tip portion 54e have a shape in which a metal plate is bent so as to have a substantially letter "J" shape in a side view, and have a uniform thickness. Specifically, the first tip portion 54d has a shape extending in the +X direction, and the second tip portion 54e has a shape extending upward (+Z direction) from the upper surface of the first tip portion 54d. The connecting portion 52 has a shape extending in the −X direction from the upper portion of the second tip portion 54e. As described above, unlike the connecting member 50 shown in FIG. 2 in which the thickness of a part of the connecting member 50 is thicker than that of the other parts, the overall thickness is uniform in the fifth modified example. Therefore, it can be formed by a relatively simple processing method, such as bending, of a metal plate, for example. The entire lower surface of the first tip portion 54d is bonded to the upper surface electrode of the semiconductor element 30 via a bonding material 42 such as solder. As a result, the semiconductor element 30 and the connecting member 50 are electrically connected.

Figure 9:
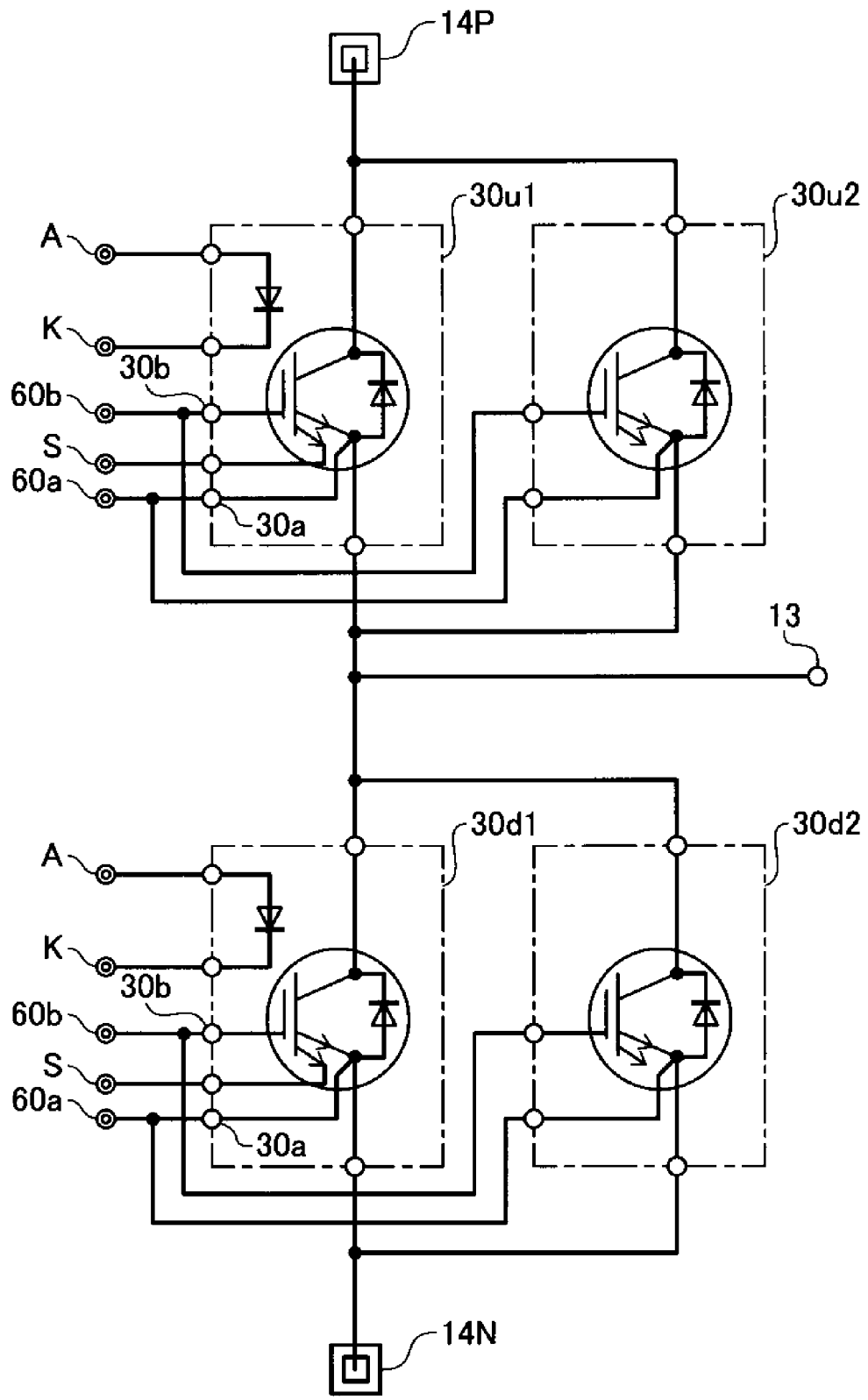
FIG. 9 is a circuit diagram of a circuit of a semiconductor module according to an embodiment of the present invention.

FIG. 9 shows a circuit diagram of the semiconductor module 1 shown in FIG. 1. The circuit diagram shows the circuit for one phase of the inverter device. The circuit includes a connection terminal 14P connected to a positive power supply, a connection terminal 14N connected to a negative power supply, and a connection terminal 13 connected to a load such as a motor. An upper arm composed of semiconductor elements 30u1 and 30u2 connected in parallel may be provided between the connection terminal 14P and the connection terminal 13, and a lower arm composed of semiconductor element 30d1 and 30d2 connected in parallel may be provided between the connection terminal 13 and the connection terminal 14N. The semiconductor elements 30u1, 30u2, 30d1, 30d2 each may have an emitter pad 30a and a gate pad 30b. The semiconductor elements 30u1 and 30d1 may further have a temperature sense diode and a current sense IGBT, respectively. The circuit may include control electrodes 60a, 60b, A, K, and S that are respectively connected to emitter pads 30a, gate pads 30b, temperature sensing pads, and current sensing pads.

In the plurality of semiconductor elements 30u1, 30u2, 30d1, and 30d2 in the semiconductor module 1, the emitter pad 30a and the gate pad 30b may be provided in the same order when viewed from the base end portion 52a. The semiconductor elements 30u1, 30d1 may be arranged closer to the control electrodes 60a and 60b than the semiconductor elements 30u2 and 30d2. In the semiconductor elements 30u1 and 30d1, the temperature sense pads and the current sense pads may be provided on the opposite sides of the emitter pad 30a and the gate pad 30b with respect to the tip end portion 54.

Although the embodiment sand the modified examples have been described, as other embodiments, the above-described embodiments and the modified examples may be combined in whole or in part.

Further, embodiments of the present invention are not limited to the above-described embodiments and modifications, and may be variously modified, replaced, or modified without departing from the spirit of the technical idea. Further, if the technical idea can be realized in another way by the advancement of the technology or another technology derived from it, it may be carried out by using that method. Therefore, the present invention encompasses all possible embodiments that may be included within the scope of the technical idea and claims appended hereto.

The feature points in the above-described embodiments may be summarized without limiting the scope of the present invention, as follows.

In one aspect, the present disclosure provides a semiconductor module, comprising: a substrate on which first, second, and third circuit boards that are electrically isolated from each other are formed; a semiconductor element having an upper surface electrode and a lower surface electrode, arranged on an upper surface of the first circuit board so that the lower surface electrode is electrically connected to the first circuit board; a connecting member that bridges the upper surface electrode of the semiconductor element and the second circuit board so as to electrically connect the upper surface electrode to the second circuit board; a wire that electrically connects the third circuit board to a first electrode that is located outside of where the first, second and third circuit boards are located in a plan view; and a sealing resin that covers and seals the substrate, the semiconductor element, the connecting member, and the wire, wherein the wire is wired from the third circuit board to the first electrode so as to cross the semiconductor element above the semiconductor element at a vertical position lower than an upper surface of the connecting member.

In the above-described semiconductor module, a lower surface of a first end portion of the connecting member may be joined to the upper surface electrode via a bonding material, and the vertical position at which said wire crosses the semiconductor element may be lower than an upper surface of the first end portion of the connecting member.

In the above-described semiconductor module, a thickness of the first end portion of the connecting member, as measured from the lower surface of the first end portion to the upper surface of the first end portion, may be 2 mm or more and 8 mm or less.

In the above-described semiconductor module, the first end portion of the connecting member may have a rectangular shape in the plan view having a short-side length of 5 mm or more and 20 mm or less.

In the above-described semiconductor module, the first end portion of the connecting member may have a rectangular shape having chamfered corners in the plan view.

In the above-described semiconductor module, the connecting member may have said first end portion, a second end portion that is electrically connected to the second circuit board, and a connecting portion that extends from an upper portion of the first end portion toward the second circuit board so as to connect the first end portion and the second end portion, the first end portion, the second end portion, and the connecting portion being integrally formed to constitute a unitary member.

In the above-described semiconductor module, the connecting member may include a member that constitutes the first end portion and a conductive plate extending from an upper surface of the member that constitutes the first end portion toward the second circuit board, one end of the conductive plate being electrically and mechanically joined to the upper surface of the member forming the first end portion and another end of the conductive plate being electrically connected to the second circuit board.

In the above-described semiconductor module, the connecting member may be a plate-shaped member, and a thickness of the first end portion may be thicker than a thickness of other portion of the connecting member.

In the above-described semiconductor module, the wire may have a wire diameter of 100 μm or more and 500 μm or less.

In the above-described semiconductor module, the wire may have a total length of 5 mm or more and 40 mm or less.

In the above-described semiconductor module, the semiconductor element may be an RC (Reverse Conducting)-IGBT (Insulated Gate Bipolar Transistor).

The above-described semiconductor module may further include a connection terminal that is electrically connected to external wiring, wherein the semiconductor element is electrically connected to the connection terminal via the connecting member and the second circuit board.

The above-described semiconductor module may further include a wiring member that connects a first connecting portion formed on the third circuit board and the semiconductor element, wherein the first connection portion is connected to a gate pad, an emitter pad, or a source pad of the semiconductor element.

In the above-described semiconductor module, a second connection portion electrically connected to the first connection portion may be formed on the third circuit board; one end of said wire may be connected to the first electrode, and another end of said wire may be connected to the second connection portion; and the first electrode and the second connection portion may be arranged at positions opposite to each other across the semiconductor element interposed therebetween.

The above-described semiconductor module may further include a case member within which the substrate, the semiconductor element, the connecting member, and the wire are installed, wherein the sealing resin fills a space defined by the case member in which the substrate, the semiconductor element, the connecting member, and the wire are installed.

As described above, the present invention has the effect of avoiding breakage of the wire even when cracks in the sealing resin occur, and is particularly useful for semiconductor modules. It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:
1. A semiconductor module, comprising:
   a substrate on which first, second, and third circuit boards that are electrically isolated from each other are formed;
   a semiconductor element having an upper surface electrode and a lower surface electrode, arranged on an upper surface of the first circuit board so that the lower surface electrode is electrically connected to the first circuit board;
   a connecting member that bridges the upper surface electrode of the semiconductor element and the second circuit board so as to electrically connect the upper surface electrode to the second circuit board;
   a wire that electrically connects the third circuit board to a first electrode that is located outside of where the first, second and third circuit boards are located in a plan view; and
   a sealing resin that covers and seals the substrate, the semiconductor element, the connecting member, and the wire,
   wherein the wire is wired from the third circuit board to the first electrode so as to cross the semiconductor element above the semiconductor element at a vertical position lower than an upper surface of the connecting member.

2. The semiconductor module according to claim 1,
   wherein a lower surface of a first end portion of the connecting member is joined to the upper surface electrode via a bonding material, and
   wherein said vertical position at which said wire crosses the semiconductor element is lower than an upper surface of the first end portion of the connecting member.

3. The semiconductor module according to claim 2, wherein a thickness of the first end portion of the connecting member, as measured from the lower surface of the first end portion to the upper surface of the first end portion, is 2 mm or more and 8 mm or less.

4. The semiconductor module according to claim 2, wherein the first end portion of the connecting member has a rectangular shape in the plan view having a short-side length of 5 mm or more and 20 mm or less.

5. The semiconductor module according to claim 2, wherein the first end portion of the connecting member has a rectangular shape having chamfered corners in the plan view.

6. The semiconductor module according to claim 2, wherein the connecting member has said first end portion, a second end portion that is electrically connected to the second circuit board, and a connecting portion that extends from an upper portion of the first end portion toward the second circuit board so as to connect the first end portion and the second end portion, the first end portion, the second end portion, and the connecting portion being integrally formed to constitute a unitary member.

7. The semiconductor module according to claim 2, wherein the connecting member includes a member that constitutes the first end portion and a conductive plate extending from an upper surface of the member that constitutes the first end portion toward the second circuit board, one end of the conductive plate being electrically and mechanically joined to the upper surface of the member forming the first end portion and another end of the conductive plate being electrically connected to the second circuit board.

8. The semiconductor module according to claim 2, wherein the connecting member is a plate-shaped member, and a thickness of the first end portion is thicker than a thickness of other portion of the connecting member.

9. The semiconductor module according to claim 2, wherein the wire has a wire diameter of 100 μm or more and 500 μm or less.

10. The semiconductor module according to claim 2, wherein the wire has a total length of 5 mm or more and 40 mm or less.

11. The semiconductor module according to claim 1, wherein the semiconductor element is an RC (Reverse Conducting)-IGBT (Insulated Gate Bipolar Transistor).

12. The semiconductor module according to claim 1, further comprising a connection terminal that is electrically connected to external wiring,
wherein the semiconductor element is electrically connected to the connection terminal via the connecting member and the second circuit board.

13. The semiconductor module according to claim 1, further comprising a wiring member that connects a first connecting portion formed on the third circuit board and the semiconductor element,
wherein the first connection portion is connected to a gate pad, an emitter pad, or a source pad of the semiconductor element.

14. The semiconductor module according to claim 13,
wherein a second connection portion electrically connected to the first connection portion is formed on the third circuit board,
wherein one end of said wire is connected to the first electrode, and another end of said wire is connected to the second connection portion, and
wherein the first electrode and the second connection portion are arranged at positions opposite to each other across the semiconductor element interposed therebetween.

15. The semiconductor module according to claim 1, further comprising a case member within which the substrate, the semiconductor element, the connecting member, and the wire are installed,
wherein the sealing resin fills a space defined by the case member in which the substrate, the semiconductor element, the connecting member, and the wire are installed.

* * * * *